Figure 1:
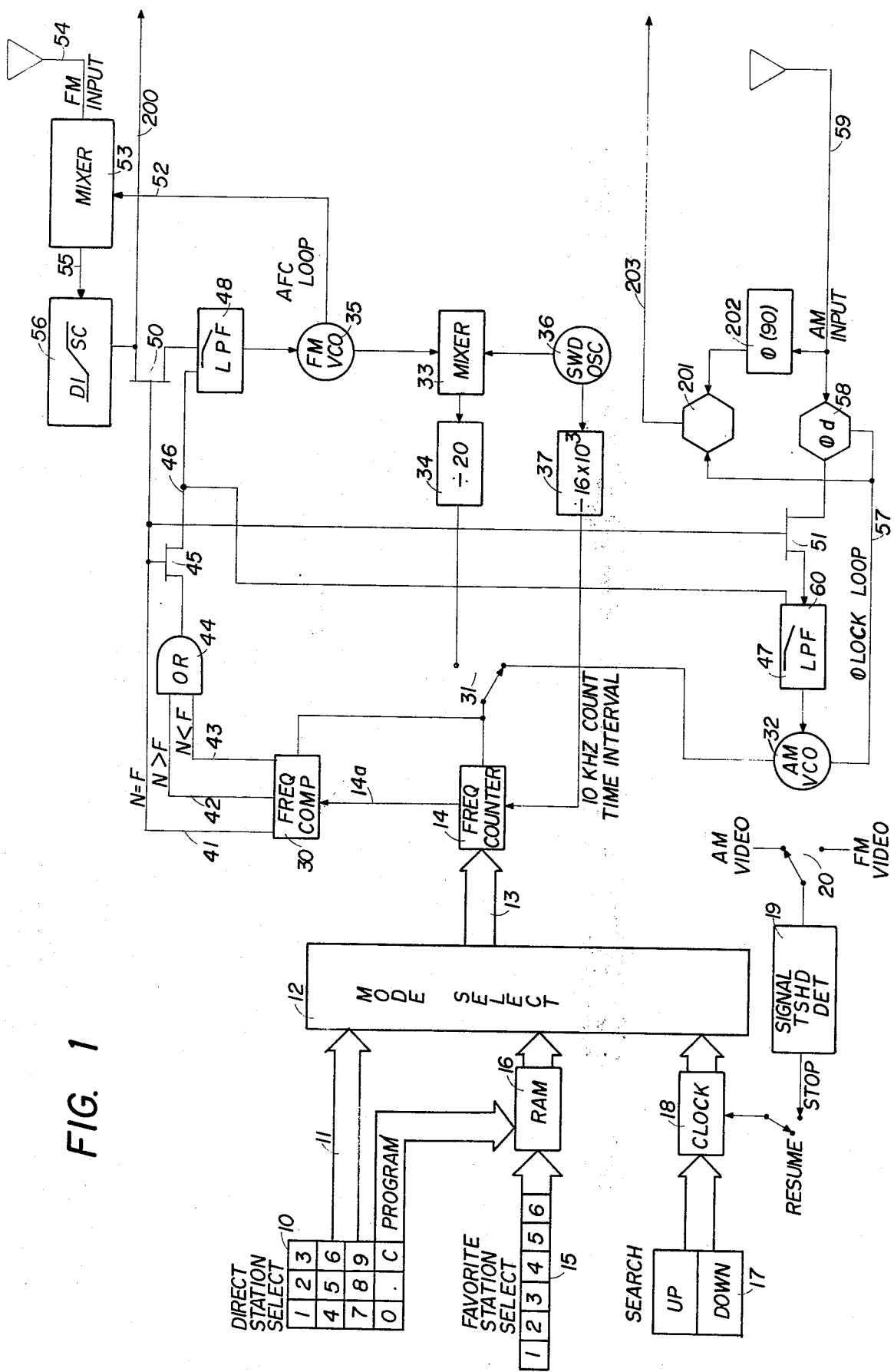

United States Patent [19]
Bell et al.

[11] 3,942,121
[45] Mar. 2, 1976

[54] DIGITAL TUNING METHOD AND SYSTEM

[75] Inventors: David B. Bell; John A. Cipher, both of Garland, Tex.

[73] Assignee: Texas Instruments Incorporated, Dallas, Tex.

[22] Filed: Sept. 9, 1974

[21] Appl. No.: 504,642

[52] U.S. Cl. ............... 325/419; 325/317; 325/421; 325/423; 325/453; 325/459; 325/460; 325/464; 325/468

[51] Int. Cl.² .......................................... H04B 1/16

[58] Field of Search ............... 325/17, 25, 315–317, 325/346, 416–423, 453, 459, 460, 462, 464, 465; 331/1 A, 10–12, 14, 16, 23, 25, 96, 107 A, 116 M, 155

[56] References Cited
UNITED STATES PATENTS

| | | | |
|---|---|---|---|
| 3,641,434 | 2/1972 | Yates | 325/25 |
| 3,748,645 | 7/1973 | Kawashima | 325/465 |
| 3,753,142 | 8/1973 | Nardin | 331/1 A |
| 3,769,602 | 10/1973 | Griswold | 325/346 |
| 3,803,494 | 4/1974 | Howell et al. | 325/459 |
| 3,835,384 | 9/1974 | Liff | 325/25 |
| 3,855,548 | 12/1974 | Nandi et al. | 331/107 A |
| 3,864,635 | 2/1975 | Ewanus | 325/421 |

*Primary Examiner*—Albert J. Mayer
*Attorney, Agent, or Firm*—Harold Levine; James T. Comfort; James O. Dixon

[57] ABSTRACT

Digitally controlled tuning by storing a digital code representative of the frequency of a selected channel and generating successive digital counts, each proportional to the number of cycles of an oscillator signal in each of a plurality of successive uniform sample intervals. The digital code is then compared with a digital count to generate a first output when equal, a second output when the code exceeds the count, and a third output when the count exceeds the code. The frequency of the oscillator is varied in response to one of the second and third outputs to increase or decrease the frequency, respectively, and to permit the frequency of the oscillator to lock in response to the first output signal.

11 Claims, 3 Drawing Figures

DIGITAL TUNING METHOD AND SYSTEM

This invention relates to digital tuning of amplitude modulation and exponential modulation systems, and more particularly to the automatic control of the frequency of a local oscillator so that the frequency thereof bears a predetermined relation to a selected code placed in storage to represent a desired frequency.

Radio and television tuning most generally encountered involves the manual adjustment of a frequency control element in the tuning circuit of the local oscillator the output of which is employed in a heterodyne arrangement for the selection of a desired signal from a receiving antenna. Heretofore, automatic tuning systems have been provided in which the frequency band of interest is traversed by a mechanical drive of the tuning element with the drive being discontinued in response to the development of an automatic gain control signal which depends upon the existence of a received broadcast signal. Still other automatic tuning arrangements have been provided.

There exists a need for an automatic tuner in which a keyboard input may be employed for the selection of a station to be tuned following which entry the system automatically will search for and lock onto the signal from the selected station.

Digital automatic tuning systems heretofore have been provided but each has been characterized by the requirement of the presence of highly stable reference oscillators. The present invention is attractive because of the ability to eliminate such precision oscillators. The present invention provides only an approximate station location following which an automatic frequency control system normally provided will lock onto the selected station.

In accordance with the present invention, a number N which represents one of a hundred channels allotted in the FM spectrum, for example, is stored and an indicia thereof is automatically displayed. This number is stored in a counter which repeatedly counts the frequency of the output signal from an electronically variable oscillator over pre-set gate intervals. The counter then produces an output state indicative of whether the oscillator frequency is greater, less, or equal to the count previously stored.

More particularly, in accordance with one aspect of the invention, a signal is processed in conjunction with a local oscillator signal by storing a digital code representative of the frequency of the selected channel and thereafter generating successive digital counts each proportional to the number of cycles of the oscillator signal in each of a plurality of successive uniform sample intervals. The digital code and the digital count are compared to generate a first output signal when equal, a second output signal when the code exceeds the count, and a third output signal when the count exceeds the code. The frequency of the oscillator is then varied in response to one of the second and third outputs to increase or decrease, respectively. The frequency of the oscillator is allowed to lock in response to the first output signal.

Figure 2:
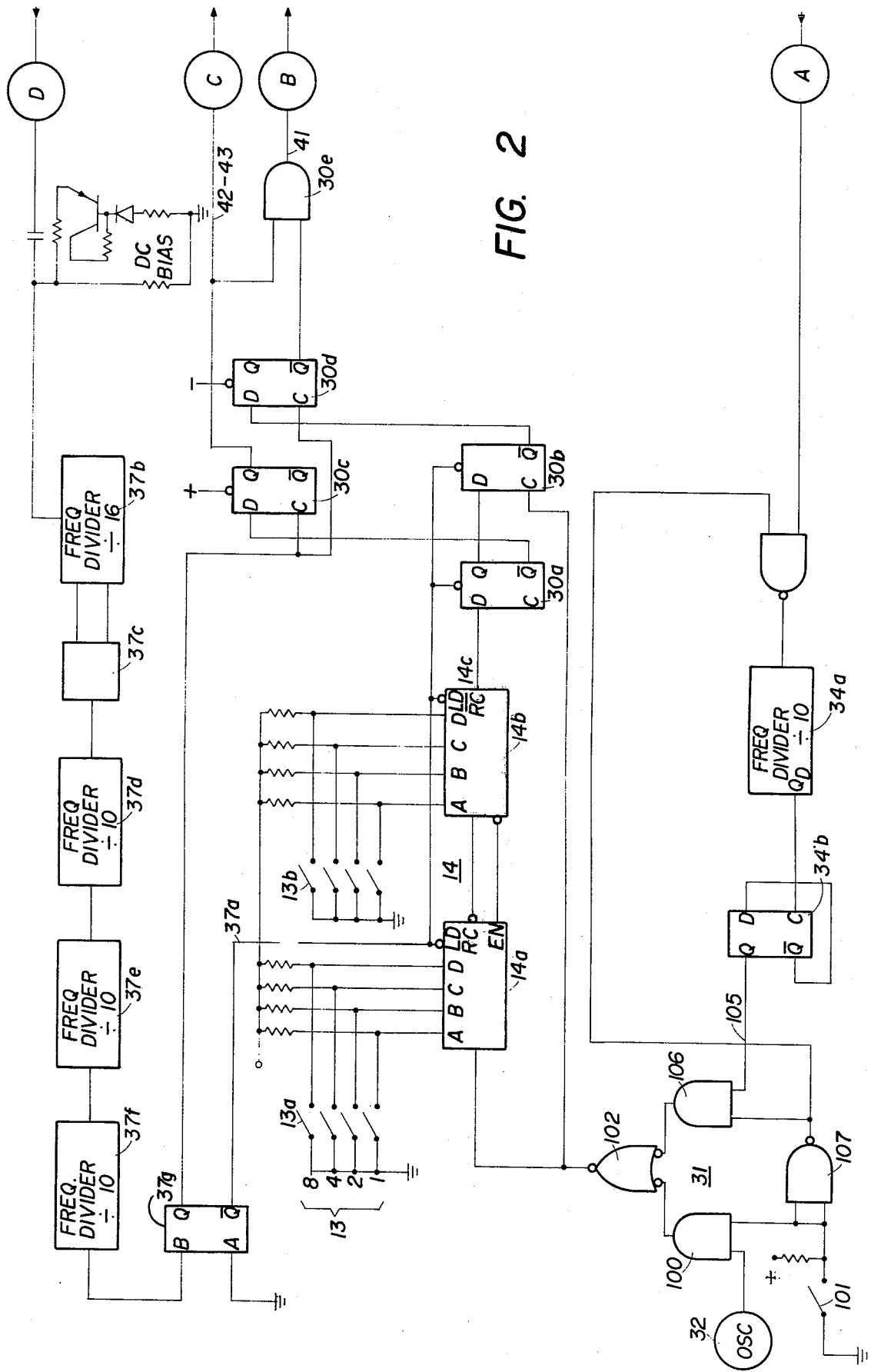
Figure 3:
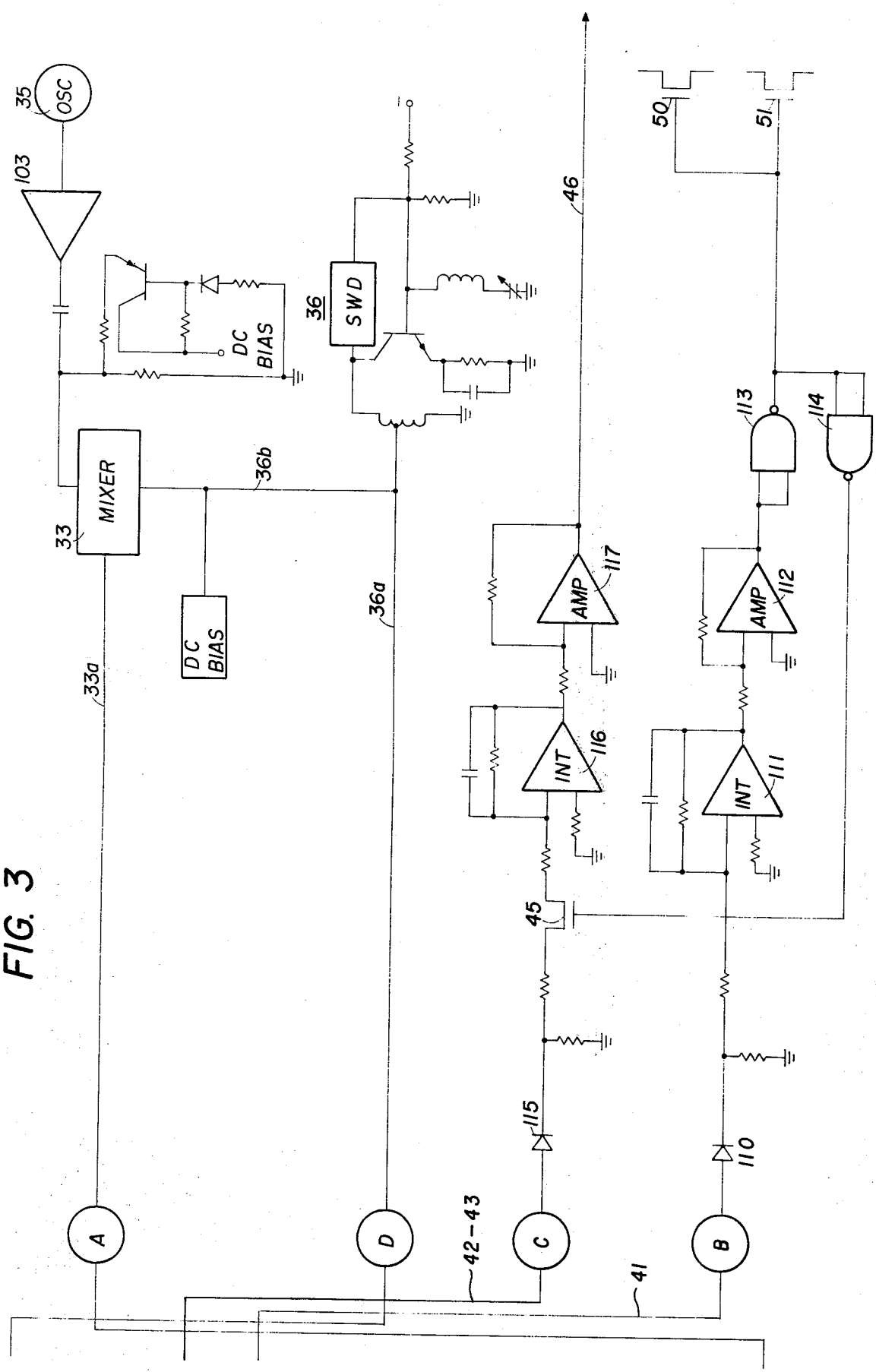

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 is a functional block diagram employed to illustrate the present invention in an AM/FM receiver system; and FIGS. 2 and 3 are detailed circuit diagrams of the portions of the system of FIG. 1.

The present invention is directed to AM/FM digital tuning. The example here described is an AM/FM receiver. However, the invention may readily be applied to control of a transmitter as well as to the timing of a television receiver. It involves controlling the frequency of a variable frequency oscillator employed to detect received signals. The oscillators here described are voltage controlled oscillators (VCO) or are current controlled oscillators (CCO).

In the AM broadcast band, there are 107 channels in a band extending from 540 kHz to 1600 kHz. Allocations are made every 10 kHz. In the FM band, there are 100 channels allocated at 200 kHz intervals over the band of from 88.1 MHz to 107.9 MHz. The present invention will be described in terms of a system wherein detection of the FM signal involves operation of an AFC loop in which the local oscillator supplies a mixer to produce an IF frequency of 73.5 MHz. In such case, the local oscillator signal (VCO) operates at 161.6 MHz to detect the first channel at 88.1 MHz. In the AM portion of the system, a phase lock loop will be employed wherein the local oscillator frequency is maintained equal to the frequency of the received signal, i.e., will be capable of being locked at each of the frequencies from 540 kHz to 1,600 kHz at 10 kHz intervals.

FIG. 1, in block diagram form, embodies the present invention for the automatic tuning of an AM or FM receiver or a combined system. A keyboard 10 is connected by way of bus 11 to a mode selector switch 12. Output states on a bus 13 are applied to a frequency counter 14. In order to select a desired station to which the system involved is to be tuned, the station or channel number is selected by depressing selected keys in keyboard 10. An encoder then applies through bus 11, mode selector switch 12 and bus 13 a multi bit code which represents the frequency to which the local oscillator must be driven in order to be tuned to the desired station. Thus, the keyboard 10 provides for manual station selection. A second mode that may be invoked through selector 12 involves the use of a second keyboard 15 which is connected to select from a random access memory (RAM) 16 a code representative of the frequency at which the local oscillator is to operate for receiving any one of a set of "favorite" stations.

In a third mode, a third keyboard 17 is provided for operation in a search mode wherein a clock oscillator 18 is driven at a frequency which is then encoded and applied through mode selector 12 and channel 13 to the counter 14. Clock 18 produces output pulses which will shift count N either up or down depending upon the key depressed in the keyboard 17 until threshold detector 19 is keyed to produce a control signal. Detector 19, having an input by way of a switch 20, is responsive to encountering any received signal of strength as to produce an output from a discriminator or detector to arrest further search.

From the foregoing it will be seen that there are three selection modes available, (1) direct manual selection through keyboard 10; (2) favorite station selection through keyboard 15; and (3) up/down search through keyboard 17.

Consider now mode 1. A preset binary coded number is loaded into a counter 14. The output of counter 14 is connected to a frequency comparator 30. Both counter 14 and comparator 30 are provided with inputs through a selector switch 31. Switch 31 at one input position leads from an AM voltage controlled oscillator 32. At a second input position, switch 31 applies to the input of counter 14 and comparator 30 a signal derived from a mixer 33 by way of a frequency divider 34. One input of mixer 33 is supplied by way of a voltage controlled oscillator 35. The second input is supplied by way of a fixed frequency oscillator 36. Fixed frequency oscillator 36 is connected through a frequency divider 37 to the control input of counter 14.

The output of counter 14 comprises overflow pulses which are applied to comparator 30. The output of comparator 30 comprises three output channels 41, 42 and 43. Channels 42 and 43 are connected by way of an OR gate 44 to the source of an FET 45 the output of which is connected by way of channel 46 to lowpass filters 47 and 48 which serve to control oscillators 32 and 35, respectively. Channel 41 is connected to the gate of FET 45 as well as to the gate of a second FET 50 and the gate of a third FET 51. The FET 50 is included in a frequency lock loop involving oscillator 35 in which the output of oscillator 35 is applied by way of channel 52 to one input of a mixer 53. An FM input signal from an antenna is applied by way of channel 54 to mixer 53. One output of mixer 53 is applied by way of channel 55 to a discriminator 56 whose output is connected to the source of FET 50 the drain of which is connected to the lowpass filter 48.

FET 51 is connected in a phase lock loop wherein the output of oscillator 32 is applied by way of channel 57 to a first input of a phase detector 58. The second input of phase detector 58 is applied by way of channel 59 from an AM antenna. The output of the phase detector 58 is applied to the source of FET 51 the drain of which is connected by way of channel 60 to lowpass filter 47. The frequency lock loop of mixer 53 and the phase lock loop of phase detector 58 serve to lock the frequencies of the oscillators 35 and 32, respectively, depending upon which one is to be employed. The frequency lock can be effective only when FET 50 or FET 51 is switched on. The AM or FM signal to be received is determined by the setting of switch 31.

In FM operation, the code applied by way of channel 13 is compared with the number of cycles of the signal from the divider network 34 during each period of a 10 kHz pulse from divider 37. If the count exceeds the code, then a signal on channel 43 drives the oscillator frequency down. If the code exceeds the count, then a signal on channel 42 serves to drive the oscillator frequency up. If the count equals the code, then the frequency lock loop of mixer 53 is actuated. A similar sequence is followed in AM operations. Thus, the system shown in FIG. 1 provides for storing a digital code representative of the local oscillator frequency for receiving a selected channel. Thereafter, successive digital counts are generated each proportional to the number of cycles of the oscillator signal in each of a plurality of successive uniform sample intervals. The digital code and the digital count are compared to generate a first output signal when equal, a second output signal when the code exceeds a count, and a third output signal when the count exceeds the code. The oscillator frequency is varied in response to one of the second and third outputs to increase or decrease the frequency, respectively, and is locked at a given frequency in response to the first output signal.

The output from the oscillator 36 is employed as the time base for setting the count interval for counter 14. The frequency of oscillation of unit 36 is so selected in relationship to the operation of oscillators 32 and 35 that a relatively simple counting operation can be used for both FM and AM. More particularly, since the phase lock loop of oscillator 32 is such that the oscillator operates at the same frequency as the incoming signal, it will be desired to lock the frequency of oscillator 32 at each of the frequencies 540 kHz, 550 kHz, 560 kHz, . . . 1,600 kHz. Since the frequency from oscillator 36 is counted down by a factor of 16,000, frequency divider 37 provides output pulses at the rate of 10,000 per second. In operation, a code for a count of fifty-four may be applied through channel 13 in response to successive depression of the keys 5 and 4 in keyboard 10. Thereafter, when the output of oscillator 32 is precisely at 540 kHz, the system will change to render FET 51 conductive and lock oscillator 32 at that frequency so that channel 1, i.e., at 540 kHz, will be selected in the AM operation.

In FM operation, if the system is such that the IF frequency is at 73.5 MHz appearing at the output channel 55 of mixer 53, assume the first FM channel at 88.1 MHz is to be selected. Oscillator 35 will operate at 161.6 MHz to produce a difference frequency of 73.5 MHz. If the oscillator 36 operates at 160 MHz, the difference frequency appearing at the output of mixer 33 is 1.6 MHz. This frequency divided by frequency divider 34 results in a signal applied through switch 31 of 80 kHz. Thus, there would be eight pulses appearing through switch 31 for each count interval controlled by the 10 Hz count from divider 37. If on FM the actuation in succession of keys 8, 8 and 1 in keyboard 10 causes the insertion into counter 14 of the code for the first FM channel. Thereafter, eight pulses through switch 31 will signal that the frequency of oscillator 35 is at the proper point on the frequency scale for receiving channel No. 1 at 88.1 MHz. The transistor 50 is then actuated to render the AFC loop of mixer 53 operative.

With the foregoing general understanding of the operation of the invention, it will be seen that numbers representing the channels to be selected may be loaded into counter 14. Codes representing numbers 54 to 160 would be loaded for AM operation. The numbers 8 to 107 would be loaded in for FM operations. In the system now to be described in connection with FIGS. 2 and 3, it should be kept in mind that the counter 14 in the specific embodiment here described is such that it has a (1) always preset therein so that the numbers loaded into the counter to actuation of the keyboard 10 will start at 53 for the first AM channel and 7 for the first FM channel, rather than 54 and 8, respectively, as above noted.

Other than the foregoing, the units shown in the system arrangement of FIG. 1 will be found in FIGS. 2 and 3. As shown in FIG. 2, the digitally coded data appearing on channel 13 to be loaded in counter 14 is represented by the settings of two banks of switches 13a and 13b.

Switches 13a and 13b are connected to the inputs of a synchronous up/down counter comprising units 14a and 14b having a preset count of (1) always loaded therein. The open or closed state of switches 13a and 13b serve to provide a preset count for the counters 14a and 14b coded to represent the frequency at which a voltage controlled oscillator is to operate. Switches 13a open or closed serve to load false or true states, respectively, into the four bits of counter 14a. Similarly, switches 13b load the four most significant bits into counter 14b.

The particular count selected by actuation of keyboard 10 and represented by the states of the switches 13a and 13b is loaded into the counters 14a and 14b once every 0.0001 second.

Reset pulses for counters 14a and 14b appear on an output line 37a leading from the monostable multivibrator unit 37g. Divider 37 is supplied from an oscillator 36 of FIG. 3 by way of a first output channel 36a. Channel 36a leads to the input of a divide-by-sixteen unit 37b whose output is connected by way of a logic transition unit 37c to three tandem divide-by-10 units 37d, 37e and 37. The output of divider 37f is connected to a control unit 37g whose output channel 37a is connected to the load input terminals of the counters 14a and 14b.

The ripple output terminal of counter 14b is connected by way of channel 14c to the clock input of a flip-flop 30a. The Q output of flip-flop 30a is connected to the D input terminal of a second flip-flop 30b. The set input terminals of flip-flops 30a and 30b are also connected to line 37a from unit 37g. The $\overline{Q}$ outputs of flip-flops 30a and 30b are connected to the D input terminals of flip-flops 30c and 30d, respectively. The Q output of flip-flop 30c represents the lines 42 and 43 of FIG. 1. The output of an AND gate 30e is the line 41 of FIG. 1, the inputs to AND gate 30e being the Q output of flip-flop 30c and the $\overline{Q}$ output of flip-flop 30d.

Oscillator signals to be counted in counter 14 are supplied by the output of either the oscillator 32 or the oscillator 35. Oscillator 32 is connected to one input of a Schmitt trigger 100. The second input of Schmitt trigger 100 is an enable terminal which is connected to a switch 101 which when closed grounds the enable terminal to force it false. When switch 101 is open, the enable input to unit 100 is true. In such case, the oscillator signal from oscillator 32 actuates the Schmitt trigger 100 to apply pulses through a NOR gate 102 to the input of the counter unit 14a as well as to the clock input terminal of flip-flop 30b.

The AM band extends from 540 kHz to 1,600 kHz with channel allocations occurring at 10 kHz intervals. The numbers set into the counters 14a, 14b by the states represented by switches 13a, 13b represents a count which is to be counted down by the pulses from NOR gate 102. The preset count from switches 13a, 13b is closed in to counter 14 once every 0.0001 second under the control of the pulses on channel 37a. If prior to the pulse on channel 37a a greater number of pulses than represented by the count from switches 13a, 13b have been transmitted from NOR gate 102, then there will be an overflow on channel 14c This will change the state of flip-flop 30a. Any further pulses from NOR gate 102 prior to the reset pulse on channel 37a will change the state of flip-flop 30b. In such case, both the $\overline{Q}$ outputs are the same. As a result, the output Q of flip-flop 30c and the output $\overline{Q}$ of flip-flop 30d will be different. Thus, it will be indicated by a false output on line 41 that the signal from NOR gate 102 does not equal the frequency set in counter 14 by switches 13a, 13b. The state on the Q output of flip-flop 30c will be false indicating on channel 42, 43 that the frequency of oscillator 32 must be driven down in order to equal the frequency set by switches 13a, 13b.

If the number of pulses transmitted from NOR gate 102 prior to the reset pulse on channel 37a is less than the count represented by switches 13a, 13b, then there will be a false output on channel 14c. As a result, both of the $\overline{Q}$ outputs of flip-flops 30a and 30b will be false. The Q output of flip-flop 30c will be false indicating that the frequency of the oscillator 32 must be driven down in order to equal the frequency indicated by the setting of switches 13a, 13b.

If the frequency of the oscillator 32 is exactly equal the frequency represented by the setting of switches 32a, 32b, then at the instant that the load pulse on channel 37a trips the flip-flops 30a and 30b, the $\overline{Q}$ outputs will be different, one true and one false, so that the Q output of flip-flop 30c and the $\overline{Q}$ output of flip-flop 30d will be true such that the output on line 41 will be true. In such case, the FET 45 is rendered nonconductive and control of the oscillator 32 is then transferred to a phase lock frequency control loop shown in FIG. 1.

A similar sequence of events takes place in order to lock in the frequency of the FM voltage controlled oscillator 35. As shown in FIG. 3, the voltage controlled oscillator 35 is connected by way of an amplifier 103 to a first input of mixer 33. The second input of mixer 33 is supplied from oscillator 36 by way of channel 36b. The difference frequency between the signals in amplifier 103 and the signals from oscillator 36 then is applied by way of channel 33a to a divide-by-twenty unit 34 which is in two stages, a divide-by-ten stage 34a and a divide-by-two stage 34b. The output of stage 34b is applied by way of channel 105 to one input of a Schmitt trigger 106 the output of which is connected to a second input of NOR gate 102. The enable input of Schmitt trigger 106 is connected to the output of a NAND gate 107 both inputs of which are connected to switch 101. When switch 101 is closed, both inputs of gate 107 are false and the output to the enable input of trigger 106 is true whereas the enable input of trigger 100 is false so that only the output of divider 34b will be applied through NOR gate 102 to the counter 14. In this embodiment the oscillator 36 is at a fixed frequency of 160 MHz. The local oscillator frequencies for the FM band, for example, extend from 161.6 MHz to 181.4 MHz for an IF of 73.5 MHz. The divide-by-twenty unit 34 causes the frequency to appear on channel 105 over a frequency range of from 80 kHz to 1.07 MHz. The settings on switches 13a, 13b may then be selected through the keyboard 10 of FIG. 1 to select the desired FM channel.

In FIG. 3, line 41 is connected through a diode 110 to the input of an integrator 111. The output of integrator 111 is connected through an amplifier 112 and a Schmitt trigger 113 to the gate of FET 50. If the signal from oscillator 32 exactly equals the frequency set by the switches 13a, 13b, then there will appear a series of pulses at the 10 kHz rate, i.e., at the rate of the pulses on channel 37a on channel 41. The latter pulses are integrated in integrator 111. When a selected threshold of the Schmitt trigger 113 is reached, the FET 50 is rendered conductive and, by way of NAND gate 114, the FET 45 is rendered nonconductive. This transfers control of the oscillator 32 or 35 to its appropriate local control loop.

So long as the correct frequency is not achieved, then a signal on line 42, 43 is effective through diode 115, FIG. 3, and FET 45 to apply pulses to an integrator 116. Integrator 116 thus accumulates a voltage which is representative of the direction that the oscillator must be driven in order to approach the frequency set by switches 13a, 13b. This voltage is applied by way of channel 46 to the lowpass filter input terminal of the elements controlling oscillators 32 and 35. Thus, the control voltage on oscillators 32 or 35 will be driven up or down, depending upon the voltage on integrator 116.

From the foregoing it will be seen that the system of FIGS. 2 and 3 accomplishes AM/FM digital tuning in conjunction with a receiver system. Upon selection of an FM station through keyboard 10, the resulting code is applied through bus 13 for storage in counter 14. The selected station number may be automatically displayed (by means not shown) but in any event the corresponding code number appears as a binary number in the counters 14a, 14b of FIG. 2. Counter 14 counts the frequency over the gate interval between pulses appearing on channel 37a derived from oscillator 36. The counter then produces a signal on channel 14c if the frequency of oscillator 35 is proportionally greater than or equal to the count in counter 14. If the latter condition is true, then the state on channel 14c goes true. If the frequency is proportionally less than the number stored in counter 14, then the state of channel 14c remains false. If the oscillator frequency is proportionally equal to the number stored in the counter 14, then a signal is generated on channel 41 which transfers control of the frequency of oscillator 35 to a frequency lock loop such as shown in FIG. 1. Normal FM VCO frequencies must occur somewhere between 161.6 MHz and 181.4 MHz for an IF operation at 73.5 MHz. Such frequencies are to be translated to a lower frequency usable in standard logic such as TTL. This is accomplished by using the reference oscillator 36 at 160 MHz and the mixer 33 with the output of mixer 33 occurring at frequencies over the range of from 1.6 MHz to 21.4 MHz. Divider 34 associated with mixer 33 is constructed to divide the output thereof by a factor of (20) such that the output of divider 34 ranges from 80 kKz to 1.07 MHz. Upon entry of a station selection, counter 14 begins counting the FM VCO output frequency after it has been mixed down and divided. Counter 14 counts during known gate intervals controlled by the output of oscillator 36 counted down by a factor of 16,000 to a 10 kHz frequency. At the end of the first gate interval, a command is sent to increase or decrease the FM VCO oscillator 35 with the VCO oscillator 35 until the frequency counter is satisfied that the VCO frequency and the number stored in counter 14 are compatible during the gate length. At that instant, detector 30 then sends a signal out of the frequency counter circuit and by way of channel 41 to switch the automatic frequency control circuit into the FM receiver for fine tuning control.

The AM digital tuning is similar to the FM tuning operation. The AM VCO 32 operates at frequencies of received signals between 540 kHz and 1.6 MHz.

While only the manual tuning operation involving keyboard 10 has been described, it will be appreciated that use of the keyboard 15 and RAM 16 and keyboard 17 may similarly be accommodated in the operations involving counter 14.

The FM demodulated signal that appears at the output of discriminator 55 and may be applied by way of channel 200, FIG. 1, to the appropriate circuitry employed in receivers while handling the demodulated signal. In the AM section, a second phase detector 201 has its inputs connected to the output of oscillator 32 and its inputs connected to the output of a phase shift unit 202. The phase shift of 90° permits the phase detector 201 to produce an output signal on channel 203 which is the demodulated AM signal to be used in succeeding portions of the receiver system.

The portions of the system involving the phase lock loop involving detector 58 and the demodulating detector 201 may be as described in detail in copending application Ser. No. 498,493, filed Aug. 19, 1974, and entitled "A Phase Lock Loop AM/FM Receiver".

The portions of the system involving the AFC loop of mixer 53 in general are well known and have not been described in detail. They may be of the type shown in "Electronic and Radio Engineering" by Terman, McGraw-Hill, 1955, page 953.

Thus, in accordance with the present invention, digital tuning for an RF system is provided. The system may be either a receiver or a transmitter wherein the local oscillator is employed in connection with modulation/demodulation operations.

A keyboard input means is provided to produce a digital code representative of the frequency at which the local oscillator is to operate in connection with transmitting or receiving on a given channel. A counter is provided to receive and store the code. A signal source of fixed low frequency, preferably a surface wave device controlled oscillator, is provided to apply reload pulses to reload the code in the counter as to define a train of fixed sample intervals. A variable frequency oscillator is connected to apply pulses to the counter at a rate so proportioned as to reduce the count in the counter to zero in any of the intervals during which the output frequency of the variable oscillator equals the frequency of the selected channel. Circuit means are provided to increase the frequency of the variable frequency oscillator when the code exceeds the count. The frequency of the variable frequency oscillator is descreased when the count exceeds the code.

A control loop is provided for the variable frequency oscillator. Means are then provided to transfer control of the variable frequency oscillator to the loop coincident with one of the reload pulses in response to a zero count in the counter at the end of any of the sample intervals.

If the fixed frequency oscillator is set to have an output of 160 MHz, it may then be divided down by a factor of 16,000 to provide input pulses at the rate of 10,000 reload pulses per second to the counter, thereby to set the sample intervals. Because of channel allocation at 10,000 kHz intervals in the AM broadcast band and of 200,000 kHz in the FM band, operation of the fixed frequency oscillator at 160 MHz provides a unique capability for tuning both in the FM and AM bands. In tuning in the FM band, the fixed frequency oscillator is mixed with the output of the variable frequency oscillator and the difference frequency output is divided down by a factor of 20. As a result, the channel number in the FM band may be coded into the counter. The pulses then applied to the counter will bear an integer relationship to the frequency of the selected channel, i.e., for channel 1 in the example earlier given herein, there will be 8 pulses applied to the counter during an interval of 1/10,000 second. If the AM channel selected is at 540 kilocycles, the phase lock loop will cause the AM local oscillator to operate as to apply fifty-four pulses to the counter during 1/10,000 second. Thus, in both cases the oscillator outputs at the desired frequency bear an integer relationship to the channel code over the sample interval.

In either the AM or FM operation of a receiver, temporary failure of the received signal will cause loss of control in the frequency control loop. In the present system, there occurs immediate transfer of control of the local oscillator frequency back to the tuning network so that the local oscillator frequency will be repeatedly reset to the point in the frequency band dictated by the code loaded into the counter. This action will continue until the lock loop again becomes operative.

Having described the invention in connection with certain specific embodiments thereof, it is to be understood that further modifications may now suggest themselves to those skilled in the art and it is intended to cover such modifications as fall within the scope of the appended claims.

What is claimed is:

1. A digital tuning system which comprises:
   a. means to store a received digital code representative of the frequency of a selected broadcast channel,
   b. variable frequency oscillator means,
   c. means receiving the output of said variable frequency oscillator and generating a digital count representative of the frequency of said variable frequency oscillator,
   d. means receiving said digital code from said storage means and said digital count and producing a first signal when the frequency of said variable frequency oscillator is less than the frequency represented by said digital code, a second signal when the frequency of said variable frequency oscillator is greater than the frequency represented by said digital code and a third signal when the frequency of said variable frequency oscillator is equaled to the frequency represented by said digital code,
   e. means receiving said first and second signals and varying the frequency of said variable frequency oscillator toward the frequency of said selected channel in response thereto, and
   f. means receiving said third signal and applying to said variable frequency oscillator a signal independent of said digital count causing said variable frequency oscillator to maintain an output frequency equal to the frequency of said selected channel.

2. The combination of claim 1 wherein said independent signal is produced from a lock loop including said variable frequency oscillator and a mixer receiving signals from said variable frequency oscillator and from an antenna.

3. The combination of claim 2 wherein said lock loop is a frequency lock loop and includes a discriminator.

4. The combination of claim 2 wherein said lock loop is a phase lock loop and includes a phase detector.

5. The combination of claim 1 wherein said means to generate a digital count generates successive digital counts in successive uniform sample intervals.

6. The combination of claim 1 which further comprises a fixed frequency oscillator the output of which is applied to said means to generate a digital count to cause said means to generate a plurality of successive digital counts over successive uniform sample intervals set by the frequency of said frequency oscillator.

7. In tuning an RF unit having a local oscillator, the method comprising:
   a. storing a digital code representative of the frequency of a selected channel,
   b. generating successive digital counts each proportional to the number of cycles of said oscillator signal in each of a plurality of successive uniform sample intervals,
   c. comparing said digital code and each of said digital counts to generate a first output when said count and said code are equal, a second output when said code exceeds said count, and a third output when said count exceeds said code,
   d. varying the frequency of said oscillator in response to one of said second and third outputs to increase or decrease said oscillator frequency until said first output is produced, and
   e. switching control of said oscillator to a signal representative of a received RF signal in response to the production of said first output signal.

8. The method set forth in claim 7 in which said second and third outputs comprise pulses, respectively, of opposite polarities occurring at said sample intervals and wherein said pulses are integrated to change the frequency of said local oscillator signal in direction to produce said first output.

9. The method set forth in claim 7 in which said RF unit is a radio receiver and in which the frequency of said local oscillator signal is divided down to a frequency bearing an integer relation to the assigned channel spacings over a given broadcast band in which said receiver operates.

10. In tuning an RF unit having a local oscillator, the method comprising:
    a. storing a digital code representative of the frequency of a selected channel,
    b. periodically generating successive digital counts each proportional to the number of cycles of said local oscillator signal in successive uniform sample intervals,
    c. controlling the frequency of said oscillator by first signals representative of a comparison of said digital count and said code to drive the frequency of said oscillator toward the frequency of said selected channel, and
    d. switching control of said oscillator to a signal representative of a received frequency in said selected channel in response to a different signal representative of said comparison indicating the frequency of said oscillator is substantially equal to the frequency of said selected channel.

11. The method of claim 7 in which the control of the frequency of said oscillator is returned to said first signals when the frequency of said oscillator deviates from the frequency of said selected channel.

* * * * *